MODULE COOLING SYSTEM

Filed Dec. 24, 1964

INVENTOR
NICHOLAS M. RASKHODOFF

BY AGENT
ATTORNEY

Dec. 21, 1965 N. M. RASKHODOFF 3,224,221

MODULE COOLING SYSTEM

Filed Dec. 24, 1964 2 Sheets-Sheet 2

INVENTOR
NICHOLAS M. RASKHODOFF

BY Melvin L. Crane AGENT

ATTORNEY

United States Patent Office 3,224,221
Patented Dec. 21, 1965

3,224,221
MODULE COOLING SYSTEM

Nicholas M. Raskhodoff, Cheverly, Md., assignor to the United States of America as represented by the Secretary of the Navy Filed Dec. 24, 1964, Ser. No. 421,129
3 Claims. (Cl. 62—414)

(Granted under Title 35, U.S. Code (1952), sec. 266)

The invention described herein may be manufactured and used by or for the Government of the United States of America for governmental purposes without the payment of any royalties thereon or therefor.

The present invention is directed to a cooling system for module equipment cabinets which include a plurality of module racks therein and more particularly to a cooling system which will supply circulating air to modules in a module rack whether the rack is in the cabinet or withdrawn from the cabinet such as for repairs.

Heretofore module equipment cabinets have been assembled wherein circulating air is directed across the module racks in vertical and horizontal planes for cross cooling of electrical equipment. Such a system furnishes cooling circulating air only when the module racks are assembled within the cabinets. There has been no available cooling system prior to the present invention which will furnish circulating air through modules in a module rack when the rack is within the cabinet or which has been withdrawn from the cabinet for repairs. The cooling system of the present invention is only made possible by appropriately designing a cabinet within which a plurality of module racks are positioned upon which the modular assemblies are mounted.

It is therefore an object of the present invention to provide a cabinet that is designed to provide sufficient ventilation for electrical components housed within the cabinet.

Another object is to provide a cabinet that admits fresh air through all levels of each rack within the cabinet for uniformly cooling electrical components mounted at different levels within the module racks.

Still another object is to provide a module cabinet wherein structural members are utilized as air ducts in such a manner as to provide sufficient circulation of fresh cooling air at all levels of the cabinet to sufficiently cool all electrical components mounted within each module.

Yet another object is to provide a cabinet in which fresh cooling air is supplied to a module rack even when the rack has been withdrawn from the cabinet.

While still another object is to provide the cabinet with air vents which are isolated to prevent the loss of air when a module rack is withdrawn from the cabinet.

Figure 1:
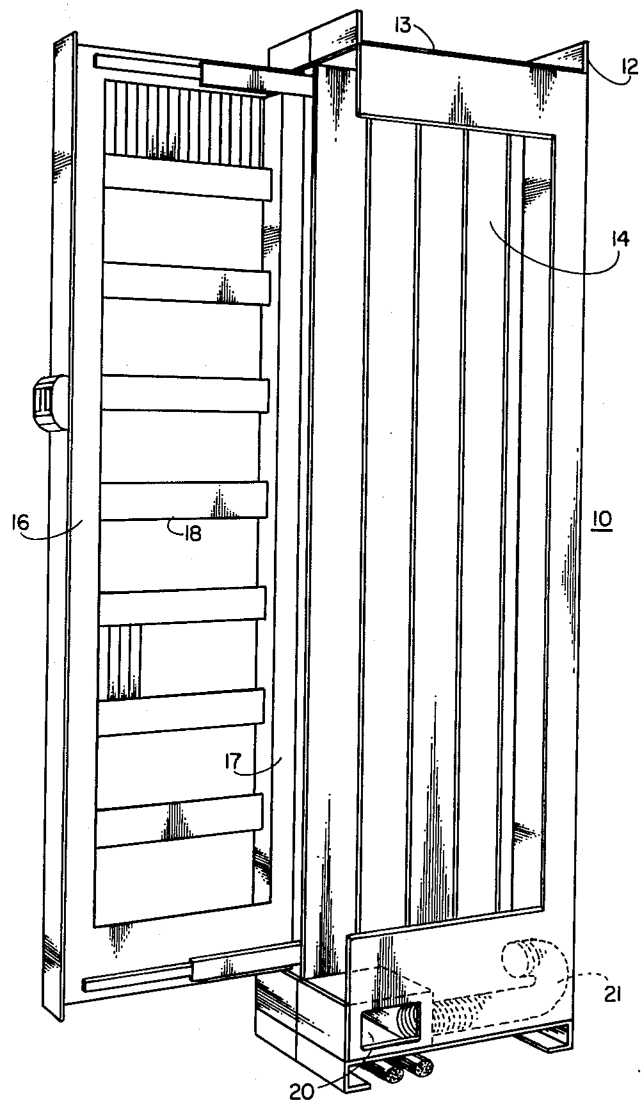
Figure 2:
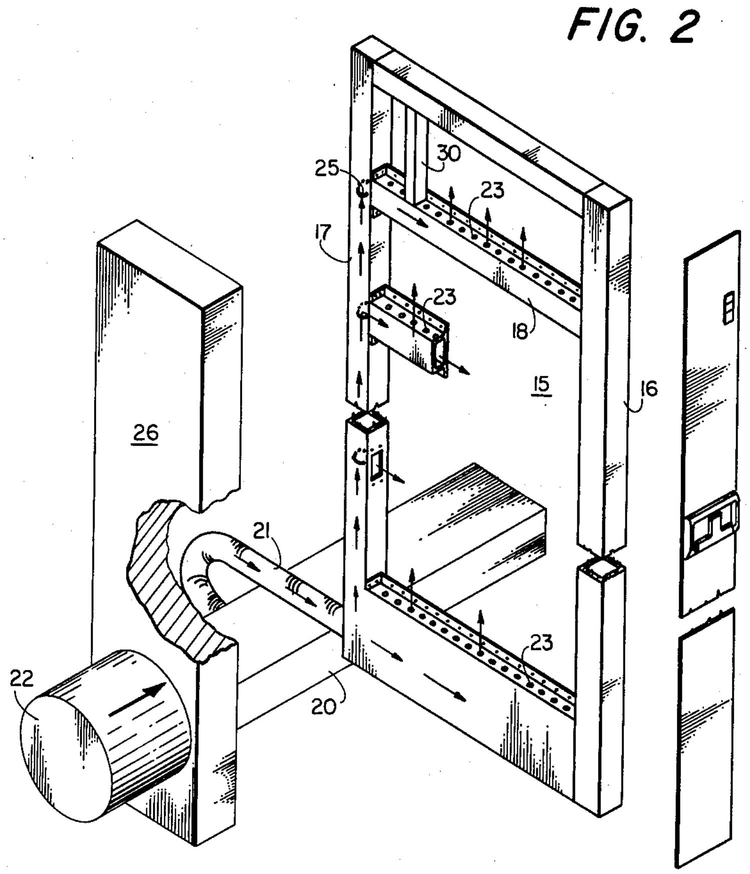
Figure 3:
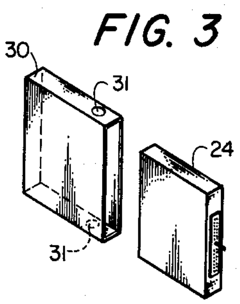

Other objects of this invention will become apparent from a more careful consideration of the following detailed description when taken together with accompanying drawing in which:

FIG. 1, illustrates a cabinet including a plurality of module racks illustrating several modules assembled on a rack shown in the open position, FIG. 2, illustrates a module rack and the air supply system through the modules, and, FIG. 3, illustrates a module can with a module assembly such as shown in position in the module rack of FIG. 2.

The present invention is directed to an air cooling system in which the cabinet is functionally designed to provide cross ventilation or cross cooling of electrical components mounted within modular components at different levels in the cabinet. According to the basic concept of the present invention, cross ventilation is obtain by utilizing the cabinet structural members as air ducts which are connected with a bellows air intake that moves out and in with movement of the module rack. Fresh air is directed at different levels from an air duct formed by an upright support member of each module rack and is directed to cross members between which individual modules are secured. The air is directed through the electrical components within modules wherein the air is then exhausted into the room. If it is necessary to correct any trouble in a module rack, the module rack is withdrawn from the cabinet and held in place by a lock in a withdrawn position. The bellows hose is drawn out with the module rack and the air is directed through the modules and thus through the electrical components within the modules and is exhausted into the room. Thus the system provides cooling air when the module racks are secured within the cabinet whereupon withdrawal of the module racks from the cabinet the air continues to be forced through the modules whether in the cabinet or not and exhausted into the room. The support structure between the module stacks in the module racks is used for an air duct member such that each duct is an air inlet feed to the various electrical modules containing electrical components assembled within such modules.

Now referring to the drawings wherein like reference characters refer to like parts throughout the specification and drawings there is shown in FIG. 1 a partial portion of a cabinet for housing electrical equipment which is cooled by the cooling system of the present invention. A cabinet 10 is formed by end plates 11, a back plate 12, a top plate 13, and upright panels 14 which divide the cabinet into a plurality of compartments. The bottom of the upright panels are cut out in order to pass the electrical cables and power supply lines to the module rack as well as to house an air supply duct or manifold 20.

Each of the compartments receive therein a module rack 15 which is formed by vertically extending upright channels 16 and 17 interconnected by horizontal cross bars 18 which support the module housing or electrical components. The back vertically extending channel 17 is closed at the top and connects at the bottom to a bellows type hose 21 through which cooling air is forced by a blower 22. Each of the horizontal bars have spaced apertures 23 in the upper surface thereof through which air is forced across the separate module units 24. The vertically extending support passage 17 of the module rack is provided with a plurality of deflectors 25 one for each horizontal cross bar to deflect the air from the air supply channel to each of the horizontal support bars 18 of the module racks. Thus the framework of the module rack and the module supports are used to provide the channels through which coolant air is forced through the module elements.

An air cooling unit 26 is provided with a suitable cooling surface such as cooling fins through which the air is drawn by a motor driven blower 22 and forced through the air supply duct or manifold 20 which crosses the bottom of the cabinet. The bellows type hose 21 is connected with the air supply manifold and to the upright support structure 17 of each of the separate module racks such that the upright structure distributes the air to the different modules. The upright 17 forms a part of the module rack and also serves to distribute the cooling air to the separate module racks. Each cross bar 18 that supports the module units connects with the upright end structure and is in the form of a passage through which air may be conducted. Each of the cross bars having the spaced apertures in the upper surface thereof distributes the cooling air along the entire length of the cross bar and flows upwardly through the modules assembled on the module rack.

Each separate module rack is connected with a bellows type hose 21 that connects with the air supply manifold in order to supply fresh cooling air to each rack. The air is drawn over the cooling system such as refrigerator coils or any other cooling means and then directed through the supply duct along the bottom of the cabinet. The air is directed into each of the separate bellows hoses connected to the supply duct and to each of the separate module racks with one hose used for each module rack. The hose extends across the bottom of the rack and is pulled outwardly with the rack when the rack is withdrawn from the cabinet for changing a module or other repairs. The bellows type hose may be coated with a coating of polytetrafluoroethylene (Teflon) to protect the hose from wear and to permit the hose to slide easier.

Thus ventilation of the electrical components is obtained by utilizing the cabinet structural members and the module racks which feed the coolant air through each separate module of each separate module rack and exhaust the air into the room within which the cabinet is located.

The module racks are assembled within a compartment and glide on telescoping hangers at the top and the bottom so that they can be withdrawn from the compartment in order to work on any of the modules. Each of the module racks is provided with a front plate which closes the compartment when the rack is locked within its compartment. The front plates of each of the module racks have a close fit with each other such that there is a neat appearance from the front. Each module rack is locked in either of two positions, completely within the compartment or with the back portion thereof secured at the front of the cabinet in order to work on any of the modules.

FIG. 3, illustrates a module can 30 having openings 31 at the bottom and top through which air passes from the horizontal support 18 through the module 24 and out through openings at the top of the can. These modules can be of different widths such that one module rack is positioned over each of the air supply vents 23 or the module may have a width to include several of the air supply vents 23.

Thus the air will be forced from the air supply blower through the air supply duct to the air supply bellows type hose up through the end supports 17 to each of the horizontal support cross bars. The air passes through the vents or apertures 23 up through the modules and out through the openings at the top of the module can. Thus it can be seen that the air is supplied to the modules whether the module racks are closed within the support housing or whether the racks are withdrawn for servicing.

Obviously many modifications and variations of the present invention are possible in the light of the above teachings. It is therefore to be understood that within the scope of the appended claims the invention may be practiced otherwise than as specifically described.

What is claimed and desired to be secured by Letters Patent of the United States is:

1. A cooling system for supplying cooling air to electrical equipment housed in a cabinet which comprises:
an air cooling means,
an air supply duct in said cabinet leading from said air cooling means and
extending across said cabinet containing said electrical equipment to be cooled,
a plurality of racks upon which said electrical equipment is assembled in individual modules
said rack including a vertically extending hollow end member and a plurality of horizontal hollow members connected with said vertically extending hollow member,
a bellows type hose connected between said air duct extending across said cabinet and said vertically extending structural members of each of said racks,
said vertically extending member of each of said racks connected with said bellows type hose cooperating therewith to supply fresh air to said electrical equipment within said modules, said plurality of horizontal hollow members each forming an air duct connected with said vertically extending hollow member of said racks to permit passage of air through the horizontal members,
each of said separate horizontal air ducts including a plurality of spaced apertures along the length in the upper face thereof,
each of said plurality of horizontal ducts having apertures in the top face thereof adapted to supply fresh air to the electrical components within modular inclosures mounted on said horizontal members, and
said bellows type hose providing a continuous flow of fresh air to said electrical components when the module racks are positioned within the cabinet or withdrawn therefrom.

2. A cooling system for supplying coolant air to electrical equipment housed in a cabinet which comprises:
an air cooling means including cooling coils over which air is directed,
an air supply duct in said cabinet leading from said air cooling means and extending across the bottom of said cabinet along the length thereof,
a plurality of module racks, each assembled in separate compartments within said cabinet,
each of said plurality of module racks including a back vertically extending support air conducting channel and a plurality of horizontal hollow members secured to said back vertical channel,
a bellows type hose connected between said air supply duct and each of said back vertically extending air conducting passage of said module racks to supply fresh air thereto,
said back vertically extending support air conducting channel of each of said racks cooperating with said bellows type hose to direct cooling air through said vertically extending support air conducting passage,
each of said horizontal hollow members forming a single air duct connected with said vertically extending channel to permit passage of air through the horizontal members,
each of said plurality of said horizontal hollow members including spaced apertures along the length in the top surface thereof to permit air to flow therefrom and across electrical equipment secured in said module rack,
said bellows type hose providing a continuous flow of fresh air to said electrical components when the module racks are positioned within the cabinet or withdrawn from it.

3. A cooling system as claimed in claim 2 wherein each back vertically extending passage of each of said module racks includes a plurality of air diverters, one for each horizontal cooling air duct.

References Cited by the Examiner

UNITED STATES PATENTS

| | | | |
|---|---|---|---|
| 1,835,085 | 12/1931 | Robson | 62—418 |
| 2,013,264 | 9/1935 | Buder | 62—418 |
| 2,198,239 | 4/1940 | Baird | 62—418 |
| 2,788,641 | 4/1957 | Franklin | 62—414 |
| 2,843,806 | 7/1958 | O'Neill | 174—15 |
| 2,935,925 | 5/1960 | D'Ooge | 98—36 |
| 2,942,856 | 6/1960 | Woodward | 165—47 |
| 3,057,672 | 10/1962 | Morita | 312—330 |
| 3,123,743 | 3/1964 | Perlmutter | 174—15 |
| 3,147,403 | 9/1964 | Cressman | 174—16 |

WILLIAM J. WYE, *Primary Examiner.*

WILLIAM J. WYE, *Examiner.*